United States Patent [19]

Igarashi

[11] Patent Number: 5,397,749
[45] Date of Patent: Mar. 14, 1995

[54] METHOD FOR ARRANGING LOGICAL CELLS IN A SEMICONDUCTOR INTEGRATED CIRCUIT

[75] Inventor: Mutsunori Igarashi, Kanagawa, Japan

[73] Assignee: Kabushiki Kaisha Toshiba, Kawasaki, Japan

[21] Appl. No.: 910,525

[22] Filed: Jul. 8, 1992

[30] Foreign Application Priority Data

Jul. 8, 1991 [JP] Japan .................................. 3-167237

[51] Int. Cl.6 ............................................ H01L 21/00
[52] U.S. Cl. ................................... 437/250; 364/488; 364/491
[58] Field of Search ............................... 364/488–491; 437/180, 250

[56] References Cited

U.S. PATENT DOCUMENTS

| | | | |
|---|---|---|---|
| 5,027,353 | 6/1991 | Jarwala et al. | 371/27 |
| 5,155,692 | 10/1992 | Lewandowski | 364/489 |
| 5,299,139 | 3/1994 | Baisuck et al. | 364/491 |

OTHER PUBLICATIONS

"Chip Layout Optimization Using Critical Path Weighting," Proc. 21st DAC, pp. 133–136, 1984, A. E. Dunlop, et al.
"Efficient Placement Algorithms Optimizing Delay for High-Speed ECL Masterslice LSI's", Proc. 23rd DAC. pp. 404–410, 1986, Y. Ogawa, et al.
"A Fast Algorithm for Performance-Driven Placement", Proc. ICCAD, pp. 328–331, 1990, Michael A. B. Jackson, et al.

Primary Examiner—Olik Chaudhuri
Assistant Examiner—H. Jey Tsai
Attorney, Agent, or Firm—Oblon, Spivak, McClelland, Maier & Neustadt

[57] ABSTRACT

A method for arranging a group of logical cells through which a signal is transmitted within an allowable delay time, consisting of the steps of determining signal lines interconnecting the logical cells of the equipotential net, defining a critical path consisting of the signal lines of all the equipotential nets, classifying the logical cells positioned between the equipotential nets as path core cells and classifying the other logical cells as path branch cells, positioning the path core cells to shorten the length of a main signal route passing through the path core cells, positioning the path branch cells to shorten the distance between the main signal route and the path branch cell for each equipotential net, and decreasing the delay time of the critical path formed by the replaced path core cells and the replaced path branch cells within the allowable delay time.

5 Claims, 9 Drawing Sheets

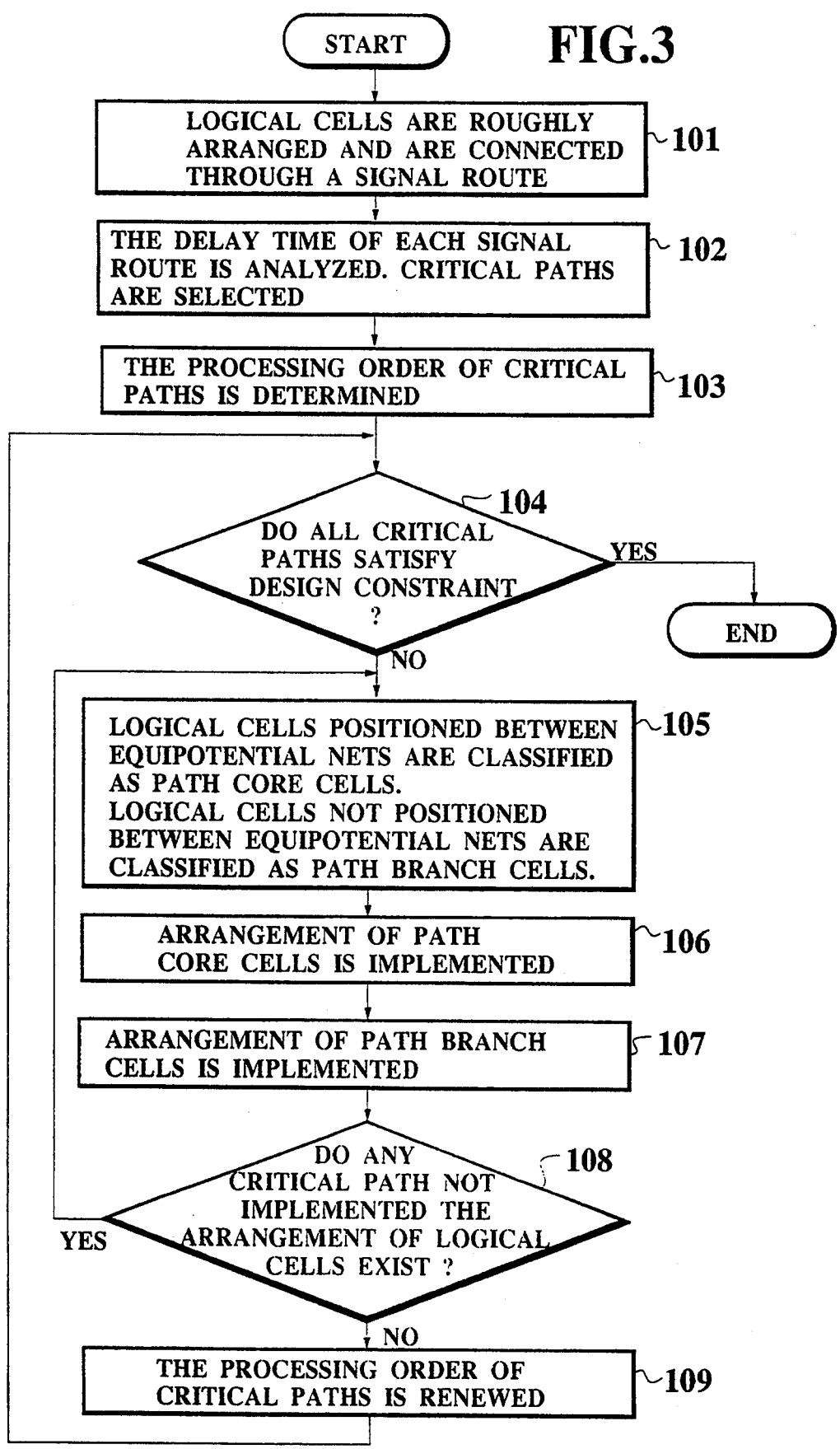

MAIN SIGNAL ROUTE

METHOD FOR ARRANGING LOGICAL CELLS IN A SEMICONDUCTOR INTEGRATED CIRCUIT

BACKGROUND OF THE INVENTION

1. Field of the Invention

The present invention relates to a method for arranging logical cells in a semiconductor integrated circuit by utilizing a computer, and, in particular, relates to a method for arranging logical cells to optimize operational characteristics such as delay time in a semiconductor integrated circuit.

2. Description of the Background Art

Conventionally, a gate array method which is also called a master slice method has been well known to design a semiconductor integrated circuit in a master chip.

In the gate array method, input/output terminal cells and basic cells respectively consisting of a prescribed number of transistors are regularly arranged in the master chip before gates of the cells are interconnected so as to satisfy design conditions given by a user, so that the semiconductor integrated circuit consisting of the cells with specific functions is manufactured.

A wafer in which the basic cells are merely arranged without interconnecting the cells before a wiring process is implemented is generally called a master wafer. In addition, a process for interconnecting the basic cells in the wiring process and for manufacturing a specialized circuit such as an inverter is called a personalization process.

Therefore, a user can arbitrarily select a prescribed number of basic cells to manufacture logical cells such as an inverter, an NAND circuit and a flip flop circuit in the personalization process.

In addition, the logical cells are interconnected by the wiring process to manufacture a standard circuit frequently utilized. The standard circuit is called a macro-cell, and many types of standard circuits are prepared as a library. Therefore, the user can arbitrarily select the standard circuits to efficiently design a semiconductor integrated circuit.

FIG. 1 is a plane view of a master chip consisting of a master wafer. As shown in FIG. 2, input/output terminal cells 12 are arranged at the peripheral regions of a master chip 11. In addition, an array region 13 for arranging macro-cells is positioned at the central region surrounded by the input/output terminal cells 12.

In the above configuration, a user selects desired type of macro-cells by a necessary number according to design conditions such as circuit connection conditions given by the user. Thereafter, the user interconnects the macro-cells according to the design conditions to implement the personalization process.

In cases where the gates of the macro-cells can be spread over the entire array region 13 in the gate array method, the entire area of the array region 13 can be utilized to arrange the macro-cells so that each macro-cell can be set at an arbitrary position. In this case, the wires interconnecting the macro-cells pass through regions not occupied by the macro-cells. Or, the wires pass through the peripheral regions of the macro-cells which are not occupied the logical cells composing the macro-cell.

A layout process for designing the arrangement of the macro-cells has been recently implemented by utilizing a computer to manufacture a large scaled semiconductor integrated circuit because the arrangement of the macro-cells is impossible to implement by hand.

The arrangement of the macro-cells requires a large scaled integration in the layout process. In addition, the operational conditions given by the user must be satisfied in the layout process. Therefore, many types of conventional methods for improving the integration of the macro-cells have been proposed and implemented. However, any type of conventional method cannot optimize the operational characteristics such as an operating frequency and operating reliability, while the conventional method can achieve the high integration of the macro-cells.

The optimization of a signal route in the integrated circuit is generally efficient to improve the operating frequency of the integrated circuit arranged on the array region 13 because the length of the signal route influences on the operational characteristics such as the operating frequency. Therefore, many conventional methods have been proposed to improve the operational characteristics of the integrated circuit. In short, the improvement is directed to decrease the delay time occurring in the signal route.

FIG. 2A shows a signal route before the operational characteristics are improved. A signal route 20 arranged in the array region 13 connects a source 21 with a sink 22. The source 21 is an input terminal to receive a signal provided to the signal route 20, and the sink 22 is an output terminal to provide the signal to a following circuit. The signal route 20 generally passes through a plurality of nets N1 to N9. Each net consists of a plurality of macro-cells 23 and signal lines for respectively connecting the macro-cell 23. The macro-cells 23 in the net are equipotential because the macro-cells 23 are directly interconnected through the signal lines. The signal lines of all the nets compose the signal route 23. The value of the delay time depends on the total length of the signal route 23. Therefore, the delay time of the signal route 23 is calculated by adding the delay time occurring in the signal lines of each net.

The operational characteristics of the integrated circuit are determined by arranging the macro-cells and the logical cells in the array region 13 in initial steps of the layout design such as a floor plan step and an arrangement step. That is, the logical cells such as and RAM and the macro-cells are roughly positioned at the array region 13 in the floor plan before the cells are arranged in detail in the arrangement step. Therefore, the operational characteristics are not varied so much unless considerable roundabout routes are taken to interconnect the macro-cells in a wiring step following the arrangement step. Accordingly, the user must consider the arrangement of the macro-cells in the initial steps so as to satisfy the operational characteristics.

An arrangement method for arranging the macro-cells by utilizing the timing analysis of the integrated circuit has been proposed (A. E. Dunlop, et al, "Chip Layout Optimization Using Critical Path Weighting", Proc. 21st DAC, pp.133–136, 1984). That is, a critical path equivalent to the signal route not satisfying the given operational characteristics is selected before each net composing the critical path is weighed by a weighing value according to the prescribed order of priority. Thereafter, the delay time of the signal lines in each net is reduced by arranging the macro-cells for each net. In this case, the layout of the nets is not changed.

FIG. 2B shows the signal route after the operational characteristics are improved by the arrangement method, the total length of the signal route being minimized by the arrangement method to improve the operational characteristics.

As shown in FIG. 2B, the signal lines formed by connecting the macro-cells which are initially positioned in the array region 13 as shown in FIG. 2A is minimized for each net by implementing the arrangement method. However, even though the length of the signal lines is minimized for each net, the length of the signal route consisting of the signal lines is not changed so much because the curves and the meanders of the signal route still remain.

Therefore, though the arrangement of the signal lines composing the net is optimized in the arrangement method, the arrangement of the nets is not optimized so that the optimization for decreasing the delay time of the signal route cannot be implemented. In other words, the unnecessary curves and meanders of the signal route cannot disappear. That is, in cases where the unnecessary curves and meanders of the signal route remains, the length of a main signal route connecting macro-cells 23 positioned between the nets is not optimized even though the total length of the signal lines is minimized for each net. Therefore, the decrease of the total delay time of the signal route is set a limit.

Accordingly, the optimization of the length of the main signal route is important as well as the minimization of the total length of the signal lines in the net.

Another arrangement method for arranging the macrocells has been proposed (Yasushi Ogawa, et al, "Efficient Placement Algorithm Optimizing Delay for High-Speed ECL Masterslice LSI's", proc. 23rd DAC, pp.404–410, 1986). That is, the restriction of the total length of the signal lines is determined by utilizing the timing analysis of the integrated circuit for each net. The timing analysis is implemented by utilizing an arrangement algorithm based on a two-division improvement. Thereafter, the allowable size of the net estimated by the restriction is compared with the size of a region to be divided in two before a weight is added to the net according to the result of the comparison.

In the above arrangement method, the optimization of the length of the signal route is not guaranteed. In addition, the number of restrictions becomes extremely large in cases where the critical path equivalent to the signal route consists of a large number of nets. Therefore, the operational characteristics improved by the two-division deteriorates so that the integration of the semiconductor circuits largely deteriorates. Moreover, in cases where the restriction relating to a plurality of nets exists, the critical path cannot be optimized because only the restriction given to each net can be considered. In other words, a plurality of nets are not simultaneously optimized.

Another arrangement method has been proposed (Masuyuki Terai, et al, "A New Min-Cut Placement Algorithm for Timing Assurance layout Design Meeting Net Length Constraint", proc. DAC, pp.96–102, 1990). That is, the constraint of the nets in the critical path is given by utilizing the min-cut placement method.

In the above arrangement method, in cases where the constraint relating to a plurality of nets exists, the critical path cannot be optimized.

Another arrangement method has been proposed (Michael A. B. Jackson, Arvind Srinivasan, E. S. Kuh, "A First Algorithm for Performance-Driven Placement", proc. ICCAD pp.328–331, 1990). That is, each net is initially given the delay constraint. Thereafter, the optimization of the length of the signal lines is implemented for each net while the constraint is renewed.

In the above arrangement method, the route of the critical path equivalent to the signal route cannot be optimized because the constraint is added for each net.

As mentioned above, the improvement of the operational characteristics is set a limit because the optimization of the length of the signal route is not guaranteed. In other words, the operational characteristics of the semiconductor integrated circuit cannot be completely improved in cases where the length of the signal lines connecting the macro-cells is minimized for each net.

SUMMARY OF THE INVENTION

An object of the present invention is to provide, with due consideration to the drawbacks of such conventional device, a method for arranging a group of logical cells through which a signal is transmitted from an input terminal to an output terminal on condition that the signal is transmitted within an allowable delay time, comprising the steps of:

determining a plurality of equipotential nets,
(1) the logical cells maintained at an equipotential state each other being roughly arranged in one equipotential net, and
(2) the equipotential state of one equipotential net differing from those of the other equipotential nets;

determining signal lines interconnecting the logical cells of the equipotential nets for each equipotential net;

defining a critical path consisting of the signal lines of all the equipotential nets;

classifying the logical cells positioned between the equipotential nets as path core cells and classifying the other logical cells as path branch cells,
(1) the signal lines connecting the path core cells in turn forming a main signal route of the critical path through which the input terminal is connected with the output terminal,
(2) the arrangement of the path core cells determining the physical topology of the critical path, and
(3) the path branch cells determining the size of the equipotential nets with the path core cells;

positioning the path core cells to shorten the length of the main signal route; and positioning the path branch cells to shorten the distance between the main signal route and the path branch cell for each equipotential net, the delay time of the critical path formed by the replaced path core cells and the replaced path branch cells being decreased within the allowable delay time.

In the above steps, a signal is transmitted from the input terminal to the output terminal through the logical cells. In this case, the wiring delay time generated by the transmission of the signal must be within the allowable delay time given by the design conditions. The wiring delay time is proportional to the length of the signal lines. Therefore, both the length of the main signal route extending from the input terminal to the output terminal and the size of each equipotential net must be decreased.

In the present invention, the logical cells positioned between the equipotential nets are defined as the path core cells which determine the physical topology of the critical path. In this case, the main signal route passes through the path core cells. In addition, the logical cells not relating to the main signal route are defined as the path branch cells which determine the size of the equipotential net.

Thereafter, the length of the main signal route is shortened by positioning only the path core cells at the first step. Therefore, the physical topology of the critical path can be simplified. Next, the size of the equipotential nets is decreased by positioning only the path branch cells at the second step. Therefore, the wiring delay time of the critical path can be efficiently decreased.

It is preferable that the step of positioning the path core cells consist of the steps of:

defining a weight Wi according to an equation Wi=Tni/D(i), (1) the main signal route being formed by connecting a series of path core cells Ci (i=−k to j) in that order, (2) the path core cell C-k agreeing with the input terminal and the path core cell Cj being adjacent to the output terminal, (3) Tni being a delay time of the equipotential net Ni positioned between the path core cells Ci, Ci+1, and (4) D(i) being an increasing function;

positioning the path core cell C0 from the coordinates (X0, Y0) to (Xr, Yr) while considering the delay time Tni of all the equipotential nets and the coordinates (Xi, Yi) of the path core cells Ci according to equations $$Xr = \sum_{i=-j}^{k} Wi \cdot Xi / \sum_{i=-j}^{k} Wi$$

$$Yr = \sum_{i=-j}^{k} Wi \cdot Yi / \sum_{i=-j}^{k} Wi; \text{ and}$$

positioning all the path core cells in the same manner as the path core cell C0.

In the above steps, the path core cells are positioned so as to decrease the curves and the meanders of the main signal route. Therefore, the length of the main signal route can be reliably shortened.

Also, the wiring delay time of all the equipotential nets and the position of all the path core cells are considered to replace a path core cell. Therefore, the length of the main signal route can be accurately shortened.

In addition, the influence of the equipotential nets which are far from the path core cell to be replaced is decreased. Therefore, the length of the main signal route can be rapidly shortened without fluctuating the arrangement of the path core cells.

It is preferable that the step of positioning the path core cells consist of the steps of:

calculating a delay time Tp1 of the critical path P1 defined by the step of defining a critical path;

defining a slack value Ts1 of the critical path P1 according to an equation Ts1=Ta1−Tp1, Ta1 indicating the allowable delay time of the critical path P1;

calculating a delay time Tp2 of the critical path P2 partly overlapping with the critical path P1, the critical path P2 being defined by the step of defining a critical path;

defining a slack value Ts2 of the critical path P2 according to an equation Ts2=Ta2−Tp2, Ta2 indicating the allowable delay time of the critical path P2;

defining a weight Wi according to an equation Wi=(Ts1/Ts2)*Tni/D(i), (1) the main signal route of the critical path P1 being formed by connecting a series of path core cells Ci (i=−k to j) in that order, (2) the path core cell C-k agreeing with the input terminal and the path core cell Cj being adjacent to the output terminal, (3) Tni being a delay time of the equipotential net Ni positioned between the path core cells Ci, Ci+1, and (4) D(i) being an increasing function;

defining a weight W'i according to an equation W'i=(Ts2/Ts1)*T'ni/D(i), (1) the main signal route of the critical path P2 being formed by connecting a series of path core cells Ci (i=−k to 0), C'i(i=1 to m) in that order, (2) the path core cell C'i being adjacent to the path core cell C0 and the path core cell C'm being adjacent to another output terminal, and (3) T'ni being a delay time of the equipotential net N'i positioned between the path core cells C'i, C'i+1;

positioning the path core cell C0 from the coordinates (X0, Y0) to (Xr, Yr) while considering the delay time of all the equipotential nets, the coordinates (Xi, Yi) of the path core cells Ci, and the coordinates (X'i, Y'i) of the path core cells C'i according to equations $$Xr = \left( \sum_{i=-j}^{k} Wi \cdot Xi + \sum_{i=1}^{m} W'i \cdot X'i \right) / \left( \sum_{i=-j}^{k} Wi + \sum_{i=1}^{m} W'i \right)$$

$$Yr = \left( \sum_{i=-j}^{k} Wi \cdot Yi + \sum_{i=1}^{m} W'i \cdot Y'i \right) / \left( \sum_{i=-j}^{k} Wi + \sum_{i=1}^{m} W'i \right);$$

and positioning all the path core cells of the critical path P1 in the same manner as the path core cell C0.

In the above steps, even though a plurality of the critical paths partly overlap with each other, the positioning of the logical cell at which the critical paths branch from each other is implemented while the slack values of the critical paths are considered.

Accordingly, the arrangement of the logical cells of each critical path can be reliably achieved.

Moreover, it is preferable that the step of positioning the path branch cells further include:

approaching the path branch cells to the middle point between the path core cells for each equipotential net in the order of magnitude of the delay time between the path branch cell and the middle point.

In the above step, if possible, the path branch cells are approached to the middle point between the path core cells. However, the approach of the path branch cells are interfered by other logical cells of other critical paths as a practical matter.

Therefore, the size of each equipotential net can be reliably decreased so that the wiring delay time is extremely reduced.

BRIEF DESCRIPTION OF THE DRAWINGS

FIG. 3 is a flow chart showing a method for arranging logical cells in a semiconductor integrated circuit according to the present invention.

DETAILED DESCRIPTION OF THE PREFERRED EMBODIMENTS

Figure 1:
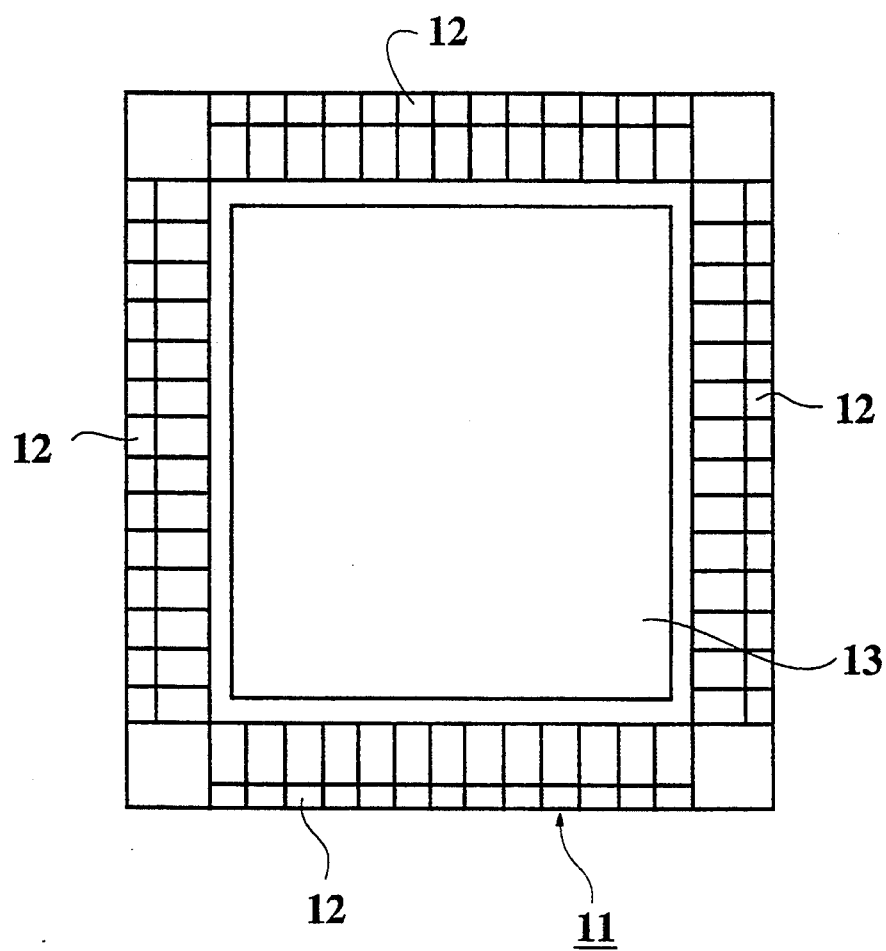
FIG. 1 is a plane view of a master chip consisting of a master wafer.
Figure 2A:
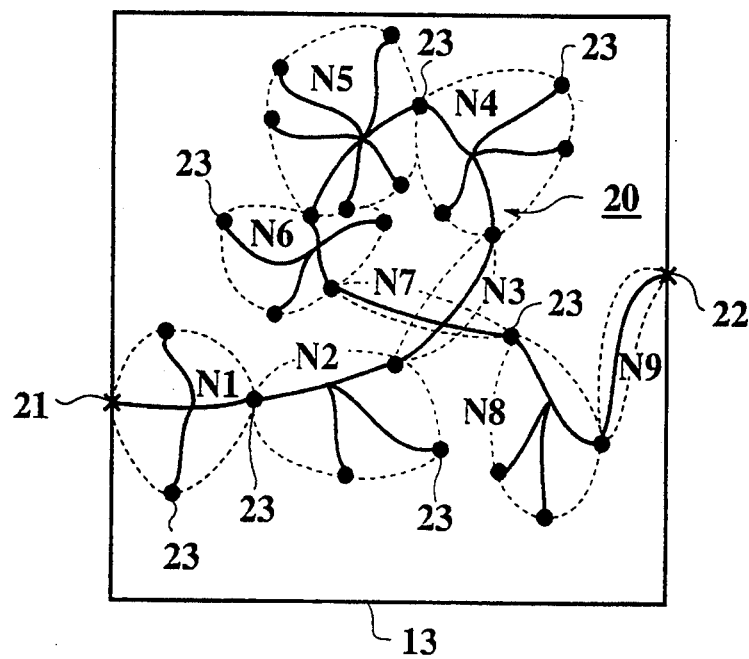
FIG. 2A shows a signal route before operational characteristics are improved.
Figure 2B:
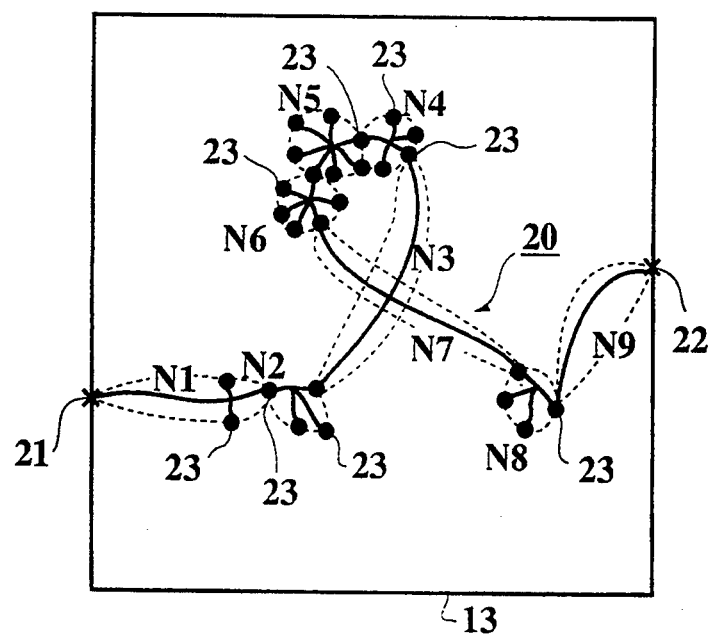
FIG. 2B shows a signal route after operational characteristics are improved by an arrangement method, the total length of the signal route being minimized by the arrangement method to improve the operational characteristics.

Preferred embodiments of a method for arranging logical cells in a semiconductor integrated circuit according to the present invention are described with reference to drawings.

FIG. 3 is a flow chart showing a method for arranging logical cells in a semiconductor integrated circuit according to the present invention.

As shown in FIG. 3, logical cells are roughly arranged on the array region 13 before each group of logical cells are connected through a signal route according to the design conditions given by a designer at a step 101.

Therefore, a large number of signal routes are drawn on the array region 13. In this case, for example, some signal routes are respectively extended from a source 21 (an input terminal) to a sink 22 (an output terminal) without partly overlapping with another signal route. The other signal routes are respectively extended from the source 21 to the sink 22 while partly overlapping with one or a plurality of signal routes.

Thereafter, the delay time is analyzed for each signal route before the designer determines whether or not the signal route should be given the design constraint such as an allowable wiring delay time according to the analysis of the delay time. Thereafter, the signal routes given the design constraint is selected. The selected signal route is called a critical path in the present invention. On the other hand, the signal route given no design constraint is not selected. That is, the arrangement of the signal routes with no design constraint is not implemented, but the arrangement of the signal routes with the design constraint is implemented according to the present invention.

Therefore, a group of critical paths are selected from the signal routes at a step 102.

Each critical path passes through a plurality of equipotential nets. Each equipotential net is extended to a plurality of layers in the integrated circuit. On the other hand, one equipotential net is electrically insulated from the other equipotential nets because the logical cell is positioned between the equipotential nets. Therefore, a wiring delay time Tn1 of an equipotential net N1 is found by summing up the wiring delay time of all layers by utilizing both a wiring length Li at a i-th layer and a conversion coefficient Ai for converting the wiring length Li into the wiring delay time Tn1.

$$Tn1 = \sum_{i=1}^{l} Ai * Li \tag{1}$$

The total wiring delay time Tp of the critical path is found by summing up the wiring delay time of all equipotential nets.

$$Tp = \sum_{i=1}^{n} Tni \tag{2}$$

The difference between the total delay time Tp and an allowable delay time Ta given by the designer according to the analysis of the delay time is called a slack value Ts.

$$Ts = Ta - Tp \tag{3}$$

That is, the slack value of the critical path is Ts. As the slack value Ts becomes smaller, the timing allowance of the critical path is smaller. Moreover, in cases where the slack value Ts is negative, the allowable delay time Ta is not satisfied.

Thereafter, the processing order of the critical paths is determined according to the order of the slack values of the critical path at a step 103. That is, in cases where the slack value Ts of the critical path is negative, the critical path is replaced at the following steps. In addition, the critical paths with the negative slack value are processed at the following steps in the order in which the critical path with the smaller slack value is processed prior to the other critical paths.

Therefore, in cases where one of the critical paths has a negative slack value Ts at a step 104, a step 105 is started.

Figure 4:
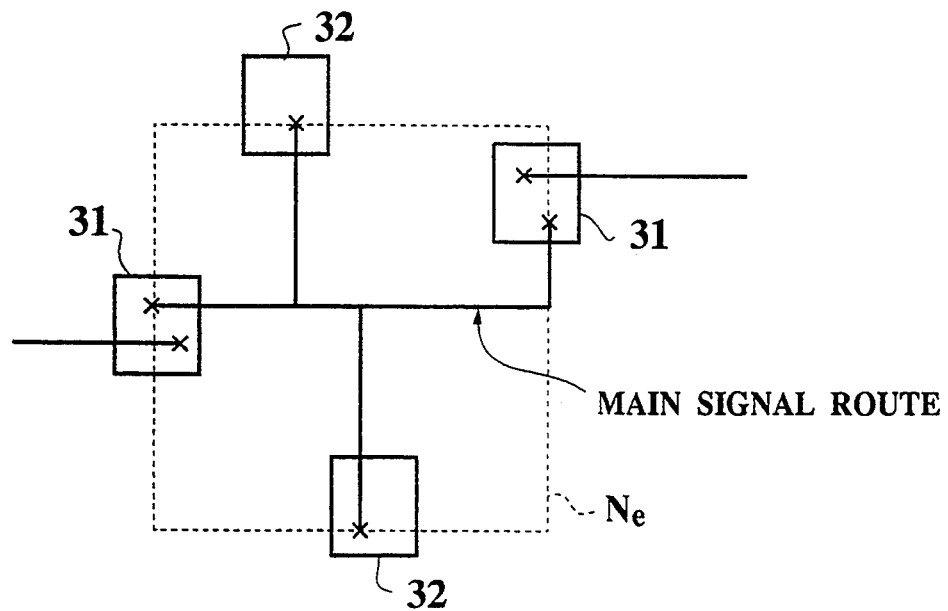
FIG. 4 is a plane view of an equipotential net consisting of a pair of path core cells and path branch cells.

The critical path with the smallest slack value is first processed among the critical paths which are not processed at the step 105. That is, the logical cells positioned between the equipotential nets are classified as path core cells 31, while the logical cells not positioned between the equipotential nets are classified as path branch cells 32 at the step 105 as shown in FIG. 4. The path core cell 31 determines the physical topology of the critical path so that a main signal route of the critical path is determined by passing through the path core cells 31 in turn. The equipotential net Ne is provided with two path core cells 31 and the path branch cells 32 from which the signal lines are drawn to the main signal route connecting the two path core cells 31. Therefore, the path branch cells 32 influence on the size of the equipotential net Ne.

After the path core cells 31 and the path branch cells 32 are determined, the arrangement of the path core cells 31 is initially implemented to optimize the physical topology of the critical path at a step 106. That is, the length of the main signal route passing the path core cells 31 are decreased.

Figure 5:
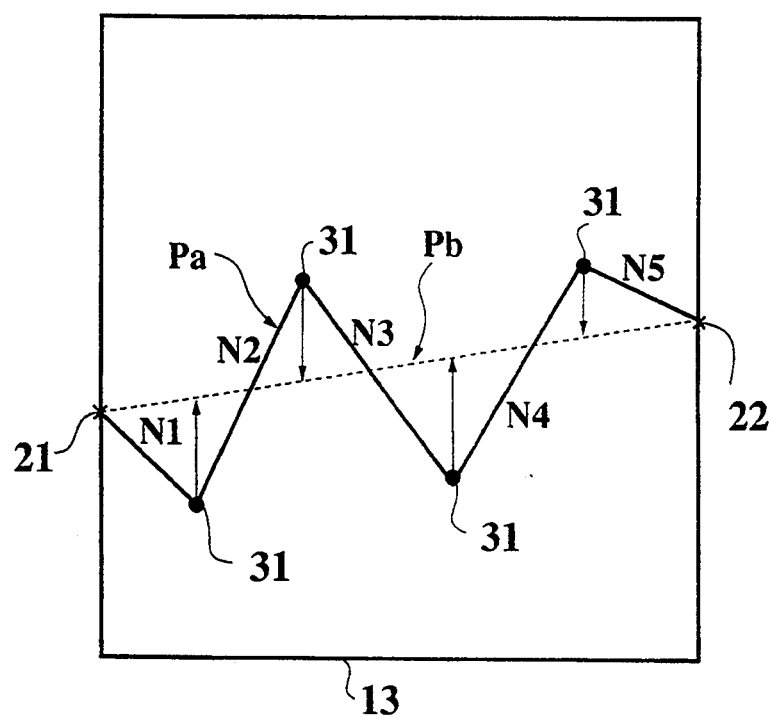
FIG. 5 shows the variance of the critical path after the arrangement of the path core cells 31 is implemented.

FIG. 5 shows the variance of the critical path after the arrangement of the path core cells 31 is implemented. As shown in FIG. 5, the critical path Pa meanders before the arrangement is implemented. However, the length of the critical path is decreased by approaching the critical path Pa to a straight broken line Pb connecting the source 21 with the sink 22. However, as a practical matter, many logical cells connected with the other critical paths (not shown) exists in the array region 13 so that each logical cell such as the path core cell 31 cannot be freely positioned. Therefore, the critical path Pa cannot be varied to the straight line Pb even though the optimized arrangement is implemented.

Figure 6:
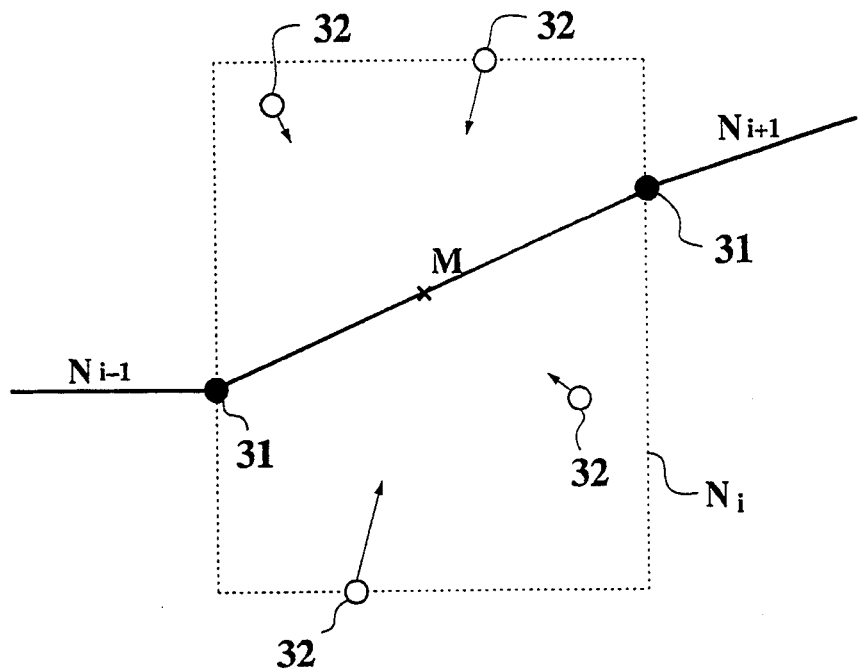
FIG. 6 is a plane view of an equipotential net showing the replacement of path branch cells.

After the arrangement of the path core cells 31 is optimized, the arrangement of the path branch cells 32 is implemented to minimize the size of the equipotential net at a step 107. That is, as shown in FIG. 6, the path branch cells 32 of the equipotential net Ni are approached to the middle point M between the path core cells 31. As a practical matter, because the approach of the path branch cells 32 are interrupted by the other logical cells, the path branch cells 32 cannot reach the middle point M.

After the arrangement of the path core cells 31 and the path branch cells 32 is implemented, the other critical path with the negative slack value Ts which is not implemented the arrangement at the steps 105 to 107 is searched at a step 108. Therefore, the other critical paths are processed at the steps 105 to 107 according to the processing order of the critical paths determined at the step 103.

After all critical paths with the negative slack value Ts are processed at the steps 105 to 107, the delay time is analyzed again for each critical path given the design constraint before the processing order of the critical paths is renewed at a step 109 in the same manner as at the step 103. In this case, even though some critical paths Pc initially have the positive slack value, the slack value of the critical paths Pc are sometimes shifted to the negative value by replacing the logical cells of the other critical paths Pd in cases where the critical paths Pc partly overlap with the other critical paths Pd.

In cases where the critical path with the negative slack value Ts exists in the array region 13, the steps 104 to 109 are repeated.

When the slack values Tp of all critical paths become positive or zero, the process is finished.

Next, a method for determining the arrangement of the path core cell 31 at the step 106 is described in detail with reference to FIG. 7.

Figure 7:
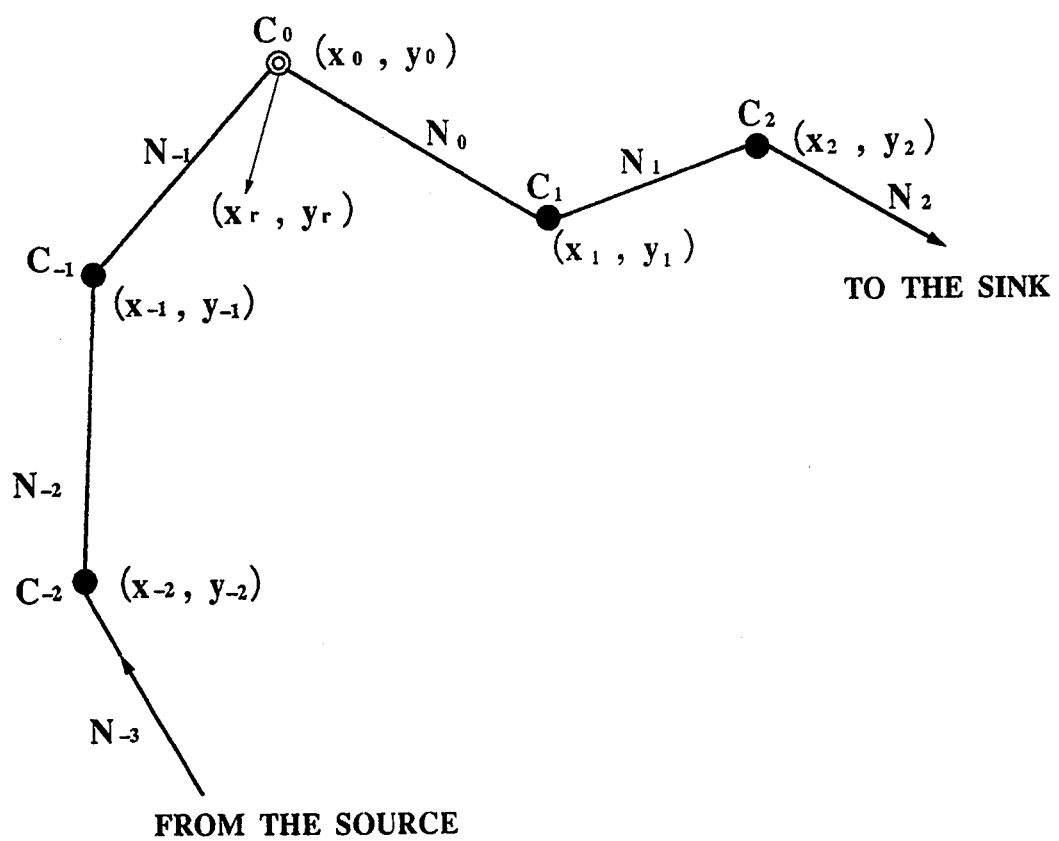
FIG. 7 shows the positioning of the path core cells arranged on a critical path Pa which does not partly overlapped with any critical path.

FIG. 7 shows the positioning of the path core cells arranged on a critical path Pa which does not partly overlapped with any critical path. The drawing of the path branch cells is omitted to simplify the description.

As shown in FIG. 7, a critical path Pa to be processed at the step 106 passes through a series of equipotential nets Ni ($i = -j$ to k). The equipotential net Ni consists of a pair of path core cells Ci, Ci+1 and the path branch cells 32. That is, the path core cell Ci is positioned between the equipotential nets Ni−1, Ni. The path core cell C-j agrees with the source 21. And, the path core cell Ck forms the equipotential net Nk with the sink 22.

Moreover, the path core cell CO is positioned while considering the influence of the other path core cells. That is, the path core cell CO is positioned so as to decrease the wiring delay time Tp of the critical path Pa.

Therefore, the wiring delay time Tni of the equipotential net Ni defined by the equation (1) is indicated as a weight Wi given to the path core cell Ci to position the path core cell CO at the optimized position according to the present invention. The value of the weight Wi is determined while considering the distance D(i) between the path core cell Ci and the path core cell CO which is positioned $$Wi = Tni/D(i) \qquad (4)$$

The value of the D(i) equals to an absolute value $|i|$. Here, D(O)=1 is defined to consider the weight WO given to the path core cell CO. That is, the weight WO of the path core cell CO equals to Tn0.

Accordingly, the influence of the wiring delay time Tni of the equipotential net Ni on the path core cell CO is decreased as the equipotential net Ni is far from the path core cell CO, while the wiring delay times Tn−1, Tn0, and Tn1 strongly influence the path core cell CO.

In cases where the coordinates of the path core cell Ci is (Xi, Yi) in the array region 13, the path core cell CO is positioned from the initial coordinates (XO, YO) to a renewed coordinates (Xr, Yr) as follows.

$$Xr = \sum_{i=-j}^{k} Wi*Xi / \sum_{i=-j}^{k} Wi \qquad (5)$$

$$Yr = \sum_{i=-j}^{k} Wi*Yi / \sum_{i=-j}^{k} Wi$$

After the path core cell CO is positioned, the other path core cells are positioned in turn in the same manner as the path core cell CO.

As a result, the curves and the meanders of the critical path disappear so that the route length of the critical path Pa is rapidly shortened. Therefore, the total wiring delay time Tp of the critical path Pa is extremely decreased.

In addition, because the influence of the wiring delay time Tni of the equipotential net Ni on the path core cell CO is decreased as the equipotential net Ni is far from the path core cell CO, the path core cells of the critical path Pa is rapidly converged to the optimized arrangement.

Next, the positioning of the path core cells arranged on a critical path Pc connected with a critical pat; Pd is described.

Figure 8:
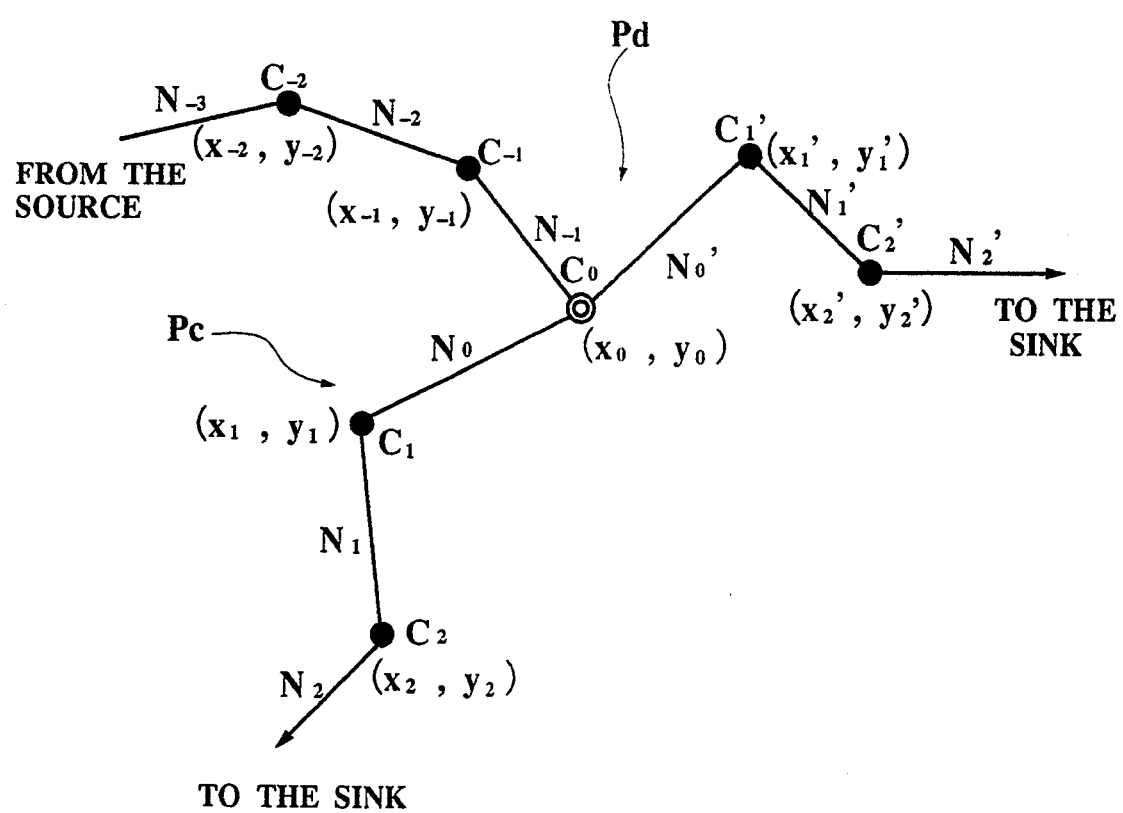
FIG. 8 shows the positioning of a path core cell arranged on both a critical path Pc and a critical path Pd.

FIG. 8 shows the positioning of a path core cell arranged on both a critical path Pc and a critical path Pd. That is, the critical path Pc partly overlaps with the critical path Pd.

As shown in FIG. 8, a critical path Pc passes through a series of equipotential nets Ni ($i = -j$ to k). The equipotential net Ni consists of a pair of path core cells Ci, Ci+1 and the path branch cells 32 (not shown). In addition, a critical path Pd passes through a series of equipotential nets Ni ($i = -j$, to −1), N'i($i = 0$ to m). The equipotential net N'i consists of a pair of path core cells C'i, C'i+1 and the path branch cells C'b (not shown). Therefore, the equipotential nets Ni ($i = -j$, to −1) belong to both the critical paths Pc, Pd. In addition, the critical paths Pc, Pd branch at the path core cell CO.

In this case, the positioning of the path core cells Ci ($i = -j$ to $-1$, and 1 to k) in the critical path Pc is implemented according to the equations (4), (5) in the same manner as in the critical path Pa because the path core cells Ci other than the path core cell CO are not directly connected with the path core cells C'i of the critical path Pd. In the same manner, the positioning of the path core cells C'i in the critical path Pd is implemented according to the equations (4), (5) when the critical path Pd is replaced.

On the other hand, when the path core cell CO is positioned, the influence of the path core cells Ci ($i = -j$ to to k), C'i ($i = 1$ to m) is considered. That is, in cases where a slack value Ts1 ($<0$) of the critical path Pc is smaller than a slack value Ts2 ($<0$) of the critical path Pd, the influence of the critical path Pc on the path core cell CO must be larger than the influence of the critical path Pd because the path core cells of the critical path Pc are required to be largely replaced to largely decrease a total wiring delay time Tp1 of the critical path Pc as compared with the path core cells of the critical path Pd. In the same manner, in cases where the slack value Ts1 of the critical path Pc is larger than the slack value Ts2 of the critical path Pd, the influence of the critical path Pd on the path core cell CO must be larger than the influence of the critical path Pc.

Therefore, the ratio of the slack values Ts1, Ts2 is multiplied to the weight obtained according to the equation (4) in cases where the path core cell CO of the critical paths Pc, Pd is positioned.

$$Wi = (Ts1/Ts2) * Tni/D(i)$$
$$W'i = (Ts2/Ts1) * T'ni/D(i) \qquad (6)$$

Here, a symbol T'ni indicates the wiring delay time of the path core cell C'i, and a symbol W'i indicates the weight given to the path core cell C'i.

The initial coordinates (XO, YO) of the path core cell CO is positioned to the coordinates (Xr, Yr) according to an equation (7).

$$Xr = \left( \sum_{i=-j}^{k} Wi*Xi + \sum_{i=1}^{m} W'i*X'i \right) / \left( \sum_{i=-j}^{k} Wi + \sum_{i=1}^{m} W'i \right) \qquad (7)$$

$$Yr = \left( \sum_{i=-j}^{k} Wi*Yi + \sum_{i=1}^{m} W'i*Y'i \right) / \left( \sum_{i=-j}^{k} Wi + \sum_{i=1}^{m} W'i \right)$$

Here, symbols X'i, Y'i are the coordinates of the path core cell C'i.

That is, in cases where the critical paths Pc, Pd are processed to decrease the delay time, the path core cell CO is positioned by utilizing the equations (6), (7) in place of the equations (4), (5).

In addition, in cases where another critical path Pe is connected with the path core cell CO, the ratio of the slack values such as $Ts1/(Ts2*Ts3)^{\frac{1}{2}}$, $Ts2/(Ts1,Ts3)^{\frac{1}{2}}$, or $Ts3/(Ts1*Ts2)^{\frac{1}{2}}$ is, for example, multiplied to the weight obtained according to the equation (4) to produce Wi, W'i, W''i. Here, Ts3 indicates the slack value of the critical path Pe, and W''i indicates the weight given to the path core cell C''i. The renewed coordinates (Xr, Yr) of the path core cell CO is found by considering the terms $\Sigma W''i * X''i$, $\Sigma W''i$, and $\Sigma W''i * Y''i$ in the same manner as in the equation (7). Here, (X''i, Y''i) indicates the coordinates of the path core cell C''i.

Accordingly, even though a plurality of critical paths branch from a path core cell as is well observed in the actual situation, all the path core cells existing in the array region 13 can be rapidly positioned to accomplish the optimized arrangement so that the delay time Tp of the critical paths is decreased.

Next, a method for determining the arrangement of the path branch cell 32 at the step 107 is described in detail with reference to FIGS. 9A, 9B.

Figure 9A:
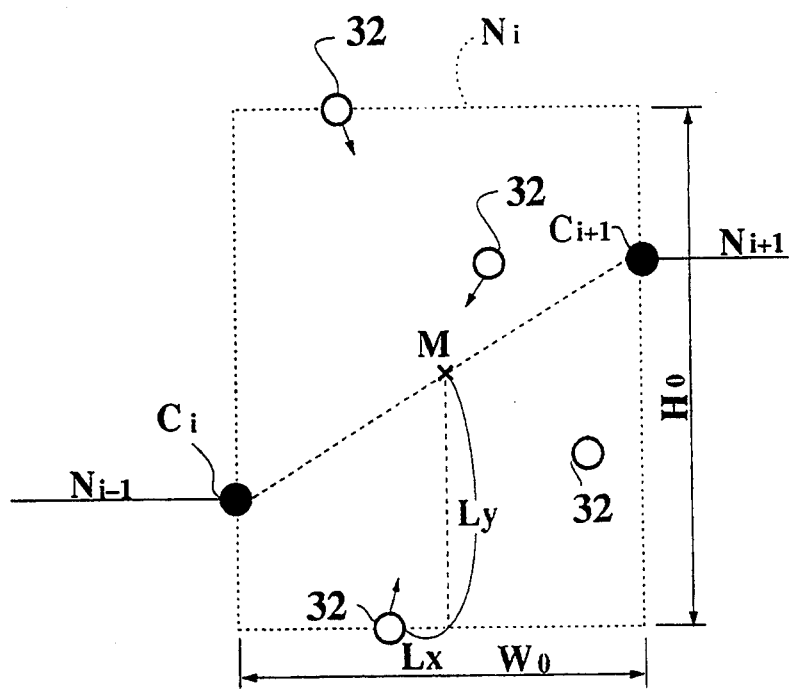
FIG. 9A shows the size of an equipotential net Ni formed by a pair of path core cells Ci, Ci+1 and path branch cells 32 before the positioning of the path branch cells 32 is implemented.

FIG. 9A shows the size of an equipotential net Ni formed by a pair of path core cells Ci, Ci+1 and path branch cells 32 before the positioning of the path branch cells 32 is implemented.

As shown in FIG. 9A, the path branch cells 32 of the equipotential net Ni of which the length equals HO and the width equals WO are approached to the middle point M between the path core cells Ci, Ci+1. In this case, the path branch cells 32 are approached to the middle point M in the order of magnitude of the delay time Tcb thereof. The delay time Tcb of the path branch cell 32 is obtained by adding the X-axis directional delay time and the Y-axis directional delay time because the wiring is implemented parallel to the X-axis or Y-axis for each layer. The delay time Tcb is found as follows.

$$Tcb = Ax*Lx + Ay*Ly \qquad (8)$$

Here, Lx indicates the wiring length in the X-axis direction, Ax indicates a conversion coefficient for converting the wiring length Lx into the X-axis directional delay time, Ly indicates the wiring length in the Y-axis direction, and Ay indicates a conversion coefficient for converting the wiring length Ly into the Y-axis directional delay time.

Figure 9B:
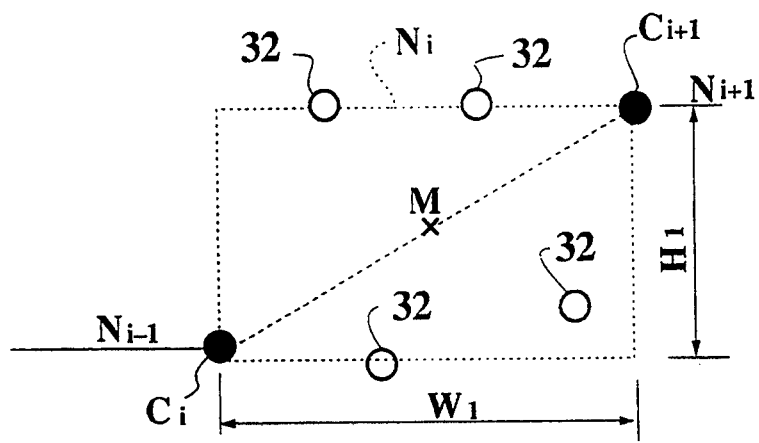
FIG. 9B shows the size of the equipotential net Ni formed by a pair of path core cells Ci, Ci+1 and the path branch cells 32 after the positioning of the path branch cells 32 is implemented.

FIG. 9B shows the size of the equipotential net Ni formed by a pair of path core cells Ci, Ci+1 and the path branch cells 32 after the positioning of the path branch cells 32 is implemented.

As shown in FIG. 9B, the wiring delay time Tni of the equipotential net Ni is minimized by approaching the path branch cells 32 to the middle point M. In this case, the path branch cells 32 of the equipotential net Ni cannot reach the middle point M because the movement of the path branch cells 32 are interrupted by the other cells belonging to the other critical paths (not shown).

As a result, the length of the equipotential net Ni becomes H1, and the width of the equipotential net Ni becomes W1. Therefore, the wiring delay time Tni of the equipotential net Ni is decreased to 73% of the initial wiring delay time in this embodiment as follows.

$$(W1 + H1)/(W0 + H0) = 0.73 \qquad (9)$$

Accordingly, because the path core cells are positioned so as to optimize the physical topology of the critical path and the path branch cells are replaced so as to minimize the wiring delay time Tni of the equipotential net after the logical cells are classified as the path core cell or the path branch cell, the wiring delay time Tp of the critical path can be minimized.

In addition, the physical topology of all the critical paths in the array region 13 can be rapidly optimized because the order of the critical paths to be positioned is determined while considering the slack value.

Therefore, the operational characteristics of the semiconductor integrated circuit can be optimized.

Next, operation examples are described with reference to FIGS. 10A, 10B and FIGS. 11A, 11B.

Figure 10A:
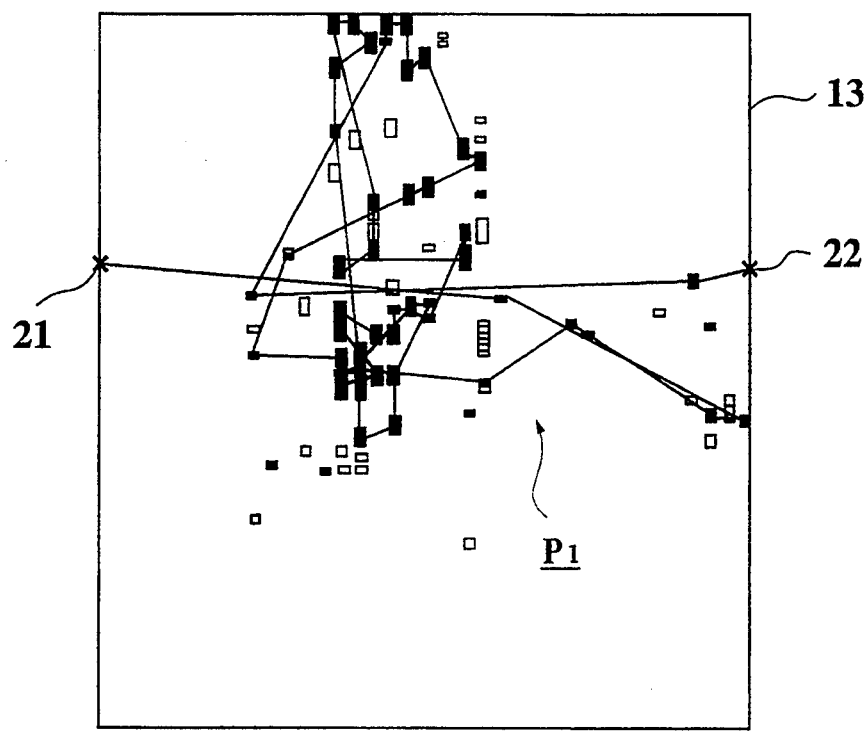
FIG. 10A shows a critical path P1 optimized by a conventional method.

FIG. 10A shows a critical path P1 optimized by a conventional method.

Figure 10B:
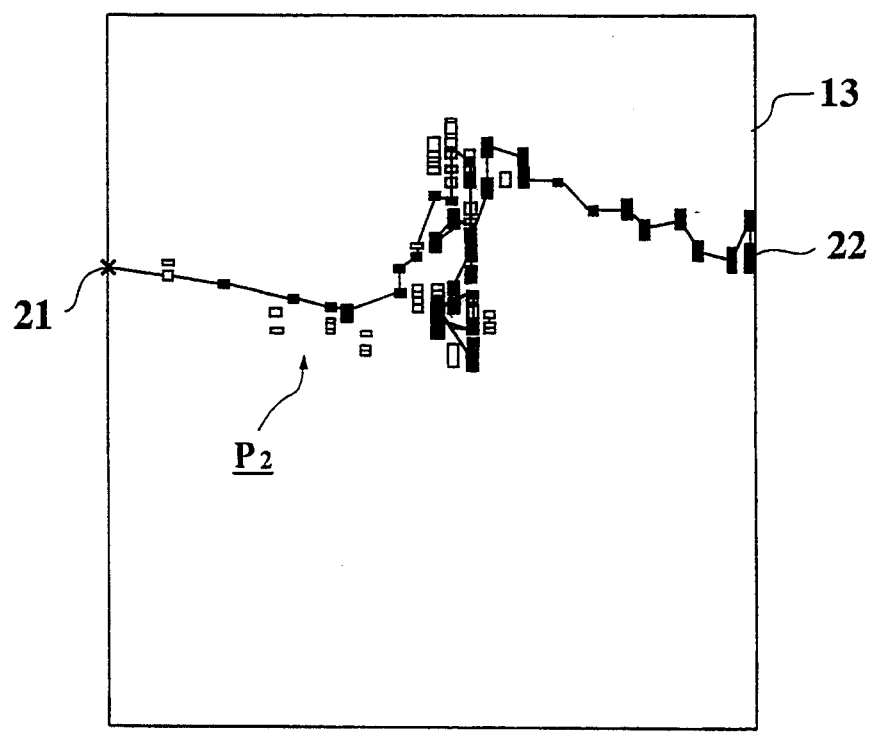
FIG. 10B shows a critical path P2 optimized by the method according to the present invention.

FIG. 10B shows a critical path P2 optimized by the method according to the present invention.

The critical paths P1, P2 shown in FIGS. 10A, 10B are obtained by optimizing a referential critical path Pr.

As shown in FIG. 10A, the optimized critical path P1 passing through the logical cells indicated by black squares has many curves and meanders. In addition, the size of the nets is still large because the logical cells indicated by white squares do not approach the critical path P1.

On the other hand, the route of the optimized critical path P2 passing through the path core cells indicated by the black squares is simplified as shown in FIG. 10B. In addition, the size of the equipotential nets is decreased. The reason is because the path core cells are positioned to decrease the number of the curves and the meanders of the critical path P2 prior to the replacement of the path branch cells. As compared with the present invention, because the logical cells are not classified as the path core cell or the path branch cell in the conventional method, the number of the curves and the meanders of the critical path P1 cannot be decreased.

As a result, though the allowable wiring delay time of the critical path is 0.48 nsec, the actual wiring delay time of the critical path P1 is 1.08 nsec. Therefore, the arrangement of the logical cells is impossible in cases where the conventional method is implemented. On the other hand, the actual wiring delay time of the critical path P2 is 0.41 nsec. Therefore, the arrangement of the logical cells is possible in cases where the method according to the present invention is implemented. In addition, the processing time is only 15.5 sec on condition that the arrangement of the critical path P2 is implemented at 10 million instructions per second by utilizing an engineering work station.

Figure 11A:
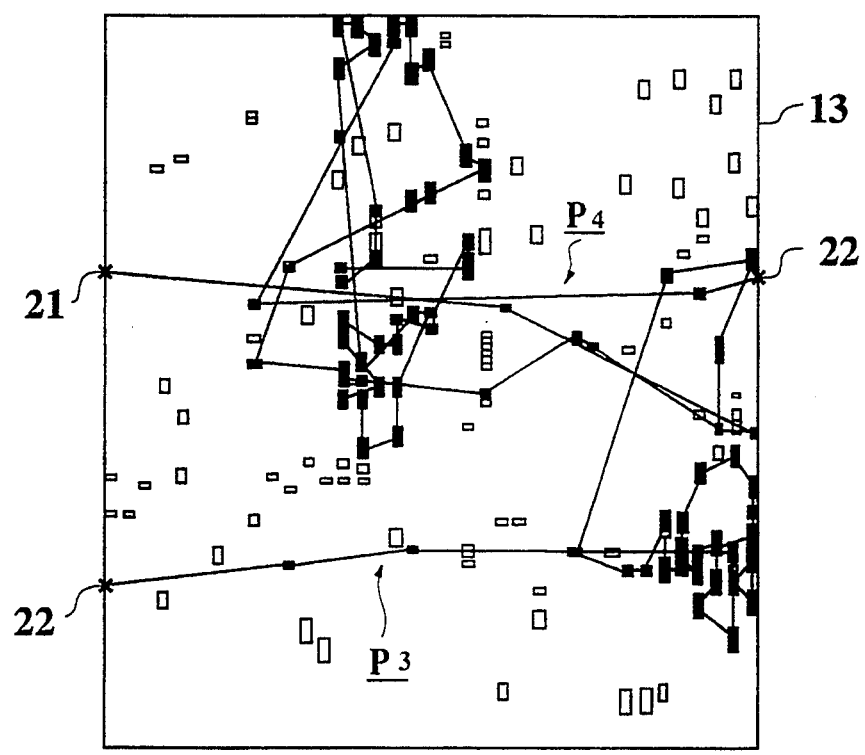
FIG. 11A shows critical paths P3, P4 optimized by a conventional method, the critical paths P3, P4 partly overlapping with each other.

FIG. 11A shows critical paths P3, P4 optimized by a conventional method, the critical paths P3, P4 partly overlapping with each other.

Figure 11B:
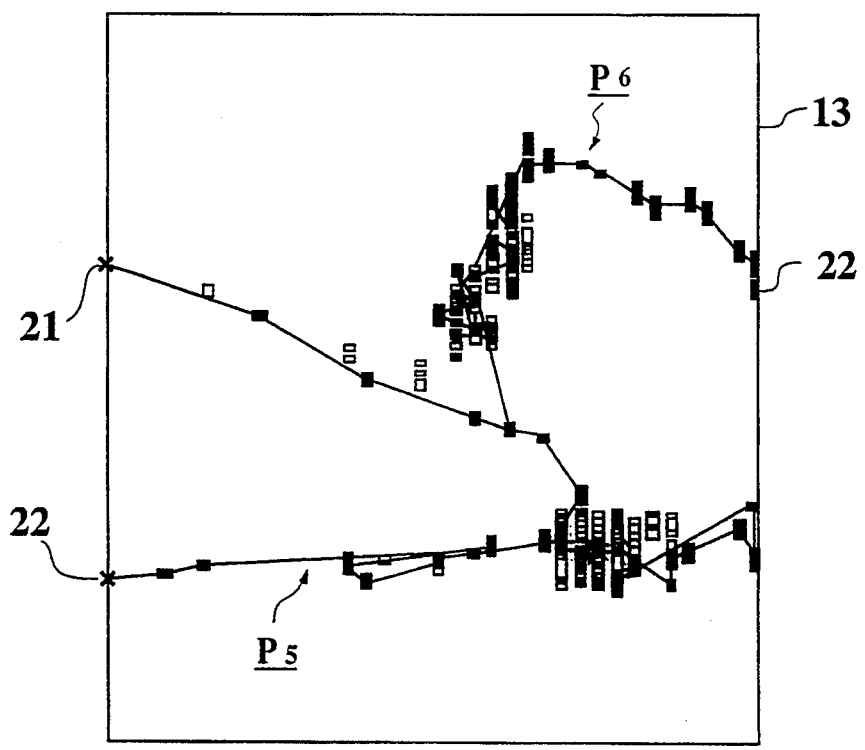
FIG. 11B shows critical paths P5, P6 optimized by the method according to the present invention, the critical paths P5, P6 partly overlapping with each other.

FIG. 11B shows critical paths P5, P6 optimized by the method according to the present invention, the critical paths P5, P6 partly overlapping with each other.

A pair of critical paths P3, P4 and a pair of critical paths P5, P6 are obtained by optimizing a pair of referential critical paths Pr1, Pt2.

As shown in FIGS. 11A, 11B the optimized critical paths P5, P6 are simplified, while the optimized critical paths P3, P4 have many curves and meanders. As a result, the wiring delay time of the critical path P5 equals 0.47 nsec and the wiring delay time of the critical path P4 equals 1.015 nsec, while the wiring delay time of the critical path P3 equals 1.08 nsec and the wiring delay time of the critical path P4 equals 2.07 nsec.

Therefore, the wiring delay time of the critical path P5 is improved by 56% by implementing the method according to the present invention. Also, the wiring delay time of the critical path P6 is improved by 51%.

In the above embodiment, the value of the D(i) equals to the absolute value $|i|$ to decrease the influence of the equipotential nets which is far from the path core cell CO. However, it is preferable that D(i) be an arbitrary increasing function such as $D(i)=2*|i|$ or $D(i)=i^2$.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A method for arranging a group of logical cells of a semiconductor device having a plurality of layers therein, through which a signal is transmitted from an input terminal to an output terminal on condition that the signal is transmitted within a predetermined delay time which is a design constraint for an allowable wiring delay time determined according to an analysis of a delay time, comprising the computer implemented steps of:

determining a plurality of equipotential nets of the logical cells, wherein (1) the logical cells in each of said plurality of equipotential nets are maintained at an equal potential, and (2) the potential of one of said equipotential nets differing from the potential of the other equipotential nets;

determining signal lines interconnecting the logical cells of each of the equipotential nets;

defining a critical path including signal lines of each of the equipotential nets;

classifying the logical cells disposed within the equipotential nets as path core cells and classifying the other logical cells as path branch cells, (1) the signal lines connecting the path core cells forming a main signal route of the critical path through which the input terminal is connected with the output terminal, (2) an arrangement of the path core cells determining the physical topology of the critical path, and (3) an arrangement of the path branch cells being determined by the size of the equipotential nets with respect to the path core cells;

positioning the path core cells within the semiconductor device so as to shorten the length of the main signal route; and positioning the path branch cells within the semiconductor device so as to shorten a distance between the main signal route and the path branch cell for each equipotential net so that the delay time of the critical path formed by the positioned path core cells and the positioned path branch cells is within the predetermined delay time;

wherein the critical path is defined to be a signal route having a design constraint.

2. A method according to claim 1 in which the step of positioning the path core cells includes the steps of:

defining a weight Wi according to an equation $$Wi = Tni/D(i),$$

(1) the main signal route being formed by connecting a series of path core cells Ci ($i = -k$ to j) in that order, (2) the path core cell C-k agreeing with the input terminal and the path core cell Cj being adjacent to the output terminal, (3) Tni being a delay time of an equipotential net Ni positioned between the path core cells Ci, Ci+1, and (4) D(i) being an increasing function;

positioning the path core cell C0 from coordinates (X0, Y0) to (Xr, Yr) while considering the delay time Tni of all the equipotential nets and coordinates (Xi, Yi) of the path core cells Ci according to equations $$Xr = \sum_{i=-j}^{k} Wi \cdot Xi / \sum_{i=-j}^{k} Wi$$

$$Yr = \sum_{i=-j}^{k} Wi \cdot Yi / \sum_{i=-j}^{k} Wi; \text{ and}$$

positioning all the path core cells in the same manner as the path core cell CO.

3. A method according to claim 1 in which the step of positioning the path core cells includes of the steps of:

calculating a delay time Tp1 of the critical path P1 defined by the step of defining a critical path;

defining a slack value Ts1 of the critical path P1 according to an equation Ts1=Ta1−Tp1, Ta1 indicating the predetermined delay time of the critical path P1;

calculating a delay time Tp2 of a critical path P2 partly overlapping with a critical path P1, the critical path P2 being defined by the step of defining a critical path;

defining a slack value Ts2 of the critical path P2 according to an equation Ts2=Ta2−Tp2, Ta2 indicating the predetermined delay time of the critical path P2;

defining a weight Wi according to an equation $$Wi=(Ts1/Ts2) \cdot Tni/D(i),$$

(1) the main signal route of the critical path P1 being formed by connecting a series of path core cells Ci (i=−k to j) in that order, (2) the path core cell C-k agreeing with the input terminal and the path core cell Cj being adjacent to the output terminal, (3) Tni being a delay time of the equipotential net Ni positioned between the path core cells Ci, Ci+1, and (4) D(i) being an increasing function;

defining a weight W'i according to an equation $$W'i=(Ts2/Ts1) \cdot Tni/D(i),$$

(1) the main signal route of the critical path P2 being formed by connecting a series of path core cells Ci (i=−k to 0), C'i(i=1 to m) in that order, (2) the path core cell C'1 being adjacent to the path core cell C0 and the path core cell C'm being adjacent to another output terminal, and (3) T'ni being a delay time of an equipotential net N'i positioned between the path core cells C'i, C'i+1;

positioning the path core cell CO from the coordinates (XO, YO) to (Xr, Yr) while considering the delay time of all the equipotential nets, the coordinates (Xi, Yi) of the path core cells Ci, and the coordinates (X'i, Y'i) of the path core cells C'i according to equations $$Xr = \left( \sum_{i=-j}^{k} Wi \cdot Xi + \sum_{i=1}^{m} W'i \cdot X'i \right) / \left( \sum_{i=-j}^{k} Wi + \sum_{i=1}^{m} W'i \right)$$

$$Yr = \left( \sum_{i=-j}^{k} Wi \cdot Yi + \sum_{i=1}^{m} W'i \cdot Y'i \right) / \left( \sum_{i=-j}^{k} Wi + \sum_{i=1}^{m} W'i \right);$$

and positioning all the path core cells of the critical path P1 in the same manner as the path core cell CO.

4. A method according to claim 1 in which the step of positioning the path branch cells further comprises the step of:

positioning the path branch cells in a neighborhood of a middle point such that a distance between the path branch cells and the middle point is decreased in the order of magnitude of the delay time of the signal line connecting between the path branch cells and the middle point.

5. A method according to claim 1 further comprising the steps of:

defining other critical paths Pi passing through other equipotential nets after the step of defining a critical path;

calculating a delay time Tpi (i=1 to n) of each critical path Pi;

defining a slack value Tsi of each critical path Pi according to an equation Tsi=Tai−Tpi, Tai indicating the predetermined delay time of the critical path Pi; and arranging the logical cells pertaining to the critical path Pi in the order of the critical paths Pi with the small slack value.

* * * * *